US009224987B2

(12) United States Patent
Song et al.

(10) Patent No.: US 9,224,987 B2
(45) Date of Patent: Dec. 29, 2015

(54) DEVICE FOR MANUFACTURING ORGANIC LIGHT-EMITTING DISPLAY PANEL AND METHOD OF MANUFACTURING ORGANIC LIGHT-EMITTING DISPLAY PANEL USING THE SAME

(75) Inventors: Ha-Jin Song, Yongin (KR);
Seung-Mook Lee, Yongin (KR)

(73) Assignee: Samsung Display Co., Ltd., Yongin-si (KR)

( * ) Notice: Subject to any disclaimer, the term of this patent is extended or adjusted under 35 U.S.C. 154(b) by 136 days.

(21) Appl. No.: 13/457,381

(22) Filed: Apr. 26, 2012

(65) Prior Publication Data

US 2013/0020018 A1  Jan. 24, 2013

(30) Foreign Application Priority Data

Jul. 18, 2011  (KR) ........................ 10-2011-0071085

(51) Int. Cl.
| | |
|---|---|
| *B32B 38/10* | (2006.01) |
| *H01L 51/56* | (2006.01) |
| *H01L 51/00* | (2006.01) |
| *C23C 14/04* | (2006.01) |
| *C23C 14/56* | (2006.01) |

(52) U.S. Cl.
CPC .............. *H01L 51/56* (2013.01); *C23C 14/048* (2013.01); *C23C 14/562* (2013.01); *H01L 51/0009* (2013.01); *H01L 51/0013* (2013.01)

(58) Field of Classification Search
CPC ........ H05B 33/10; B32B 38/10; B32B 37/00; B32B 37/06; B32B 37/025; B29C 65/1696
USPC .................... 156/272.2, 272.8, 230, 234, 238
See application file for complete search history.

(56) References Cited

U.S. PATENT DOCUMENTS

| | | | | |
|---|---|---|---|---|
| 5,904,961 | A  * | 5/1999 | Tang et al. ..................... | 427/561 |
| 6,566,032 | B1 * | 5/2003 | Boroson et al. ............... | 430/200 |
| 6,695,030 | B1 * | 2/2004 | Phillips et al. ................ | 156/540 |
| 7,852,435 | B2 * | 12/2010 | Fujisawa et al. ................ | 349/95 |
| 2004/0031442 | A1* | 2/2004 | Yamazaki et al. ............ | 118/727 |
| 2005/0275819 | A1* | 12/2005 | Tolbert et al. .................. | 355/67 |
| 2006/0040200 | A1* | 2/2006 | Song et al. ..................... | 430/199 |
| 2009/0166561 | A1* | 7/2009 | Kim et al. .................. | 250/492.1 |
| 2010/0045953 | A1* | 2/2010 | Lee et al. ........................ | 355/67 |

FOREIGN PATENT DOCUMENTS

| | | |
|---|---|---|
| KR | 10-2000 0054212 A | 9/2000 |
| KR | 10 2006 0020040 A | 3/2006 |
| KR | 10 2006 0036006 A | 4/2006 |
| KR | 10 2008 0062212 A | 7/2008 |
| KR | 10 2010 0062595 A | 6/2010 |

* cited by examiner

*Primary Examiner* — Daniel McNally

(74) *Attorney, Agent, or Firm* — Christie, Parker & Kale, LLP

(57) ABSTRACT

A device for manufacturing an organic light-emitting display panel and a method of manufacturing an organic light-emitting display panel by using the same. A device for manufacturing an organic light-emitting display panel includes a plurality of chambers; a deposition unit configured to form a transfer layer on a film supplied into the plurality of chambers in a roll-to-roll process; and a laser thermal transfer device configured to transfer a pattern of the transfer layer formed on the film onto a substrate that is supplied into a chamber of the plurality of chambers.

12 Claims, 5 Drawing Sheets

DEVICE FOR MANUFACTURING ORGANIC LIGHT-EMITTING DISPLAY PANEL AND METHOD OF MANUFACTURING ORGANIC LIGHT-EMITTING DISPLAY PANEL USING THE SAME

CROSS-REFERENCE TO RELATED APPLICATION

This application claims priority to and the benefit of Korean Patent Application No. 10-2011-0071085, filed on Jul. 18, 2011 in the Korean Intellectual Property Office, the entire content of which is incorporated herein by reference.

BACKGROUND

1. Field

Aspects of embodiments of the present invention relate to an organic light-emitting display panel, and to a device for manufacturing an organic light-emitting display panel and a method of manufacturing an organic light-emitting display panel by using the same.

2. Description of the Related Art

In general, organic light-emitting display panels include an anode, a cathode, and an emission layer (EML) interposed between the anode and the cathode.

Organic light-emitting display panels have drawn attention as a next-generation display device for their advantages of wide viewing angles, high contrast, and short response times.

Organic light-emitting display panels may further include at least one layer selected from the group consisting of a hole injection layer, a hole transport layer, an electron transport layer, and an electron injection layer, according to whether the EML is formed of a polymer organic material or a low-molecule organic material.

To display full color images of organic light-emitting display panels, the EML is patterned. In low-molecule organic light-emitting display panels, an EML is patterned using a shadow mask, while in polymer organic light-emitting display panels, an EML layer is patterned using an ink-jet printing method or a laser-induced thermal imaging (LITI) method. The LITI method enables the EML to be micropatterned, may be used for large areas, and may provide high resolution image displays.

SUMMARY

According to aspects of embodiments of the present invention, a device is configured for manufacturing an organic light-emitting display panel by which deposition and laser transferring processes of a transfer layer are performed in a high-vacuum chamber without cutting a film, and a method of manufacturing an organic light-emitting display panel uses the same.

According to an embodiment of the present invention, a device for manufacturing an organic light-emitting display panel includes: a plurality of chambers; a deposition unit configured to form a transfer layer on a film supplied into the plurality of chambers in a roll-to-roll process; and a laser thermal transfer device configured to transfer a pattern of the transfer layer formed on the film onto a substrate that is supplied into a chamber of the plurality of chambers.

The plurality of chambers may include vacuum chambers maintained in multi-stage vacuum states.

Chambers of the plurality of chambers may be sequentially positioned in line with one another.

The device may further include a substrate transfer chamber connected to a high vacuum chamber of the plurality of chambers, wherein the substrate is suppliable into the high vacuum chamber from the substrate transfer chamber.

The device may further include a washing chamber positioned at a front of the plurality of chambers, wherein the washing chamber is configured to perform a pre-treatment process in an air or inert atmosphere.

The film supplied in the roll-to-roll process may be supplied in a horizontal or vertical direction.

The film may include a base film and a light-to-heat conversion layer formed on the base film, and the deposition unit may be configured to deposit the transfer layer on the light-to-heat conversion layer.

The film may be suppliable in a horizontal direction, and the deposition unit may be positioned below the film and configured to spray a transfer layer-forming raw material from below the film toward an upper portion of the film.

The film may be suppliable in a vertical direction, and the deposition unit may be spaced apart from the film, arranged parallel to the film, and configured to spray a transfer layer-forming raw material on the film in a horizontal direction.

The device may further include a tray for mounting the substrate thereon.

The film may be suppliable in a horizontal direction, and the laser thermal transfer device may be positioned above the film and configured to irradiate laser beams from above the film toward a lower portion of the film.

The film may be suppliable in a vertical direction, and the laser thermal transfer device may be spaced apart from the film, arranged parallel to the film, and configured to irradiate laser beams on the film in a horizontal direction.

The device may further include lamination rolls positioned between the deposition unit and the laser thermal transfer device, wherein the lamination rolls are configured to attach a surface of the film on which the transfer layer is formed to the substrate.

The device may further include peeling rolls positioned next to the laser thermal transfer device, wherein the peeling rolls are configured to peel the film on which a transferring process is performed from the substrate.

According to another embodiment of the present invention, a method of manufacturing an organic light-emitting display panel includes: supplying a film into a plurality of chambers in a roll-to-roll process; forming a transfer layer on a surface of the film using a deposition unit; transferring a substrate into a chamber of the plurality of chambers from a substrate transfer chamber; and transferring a pattern of the transfer layer formed on the film onto the substrate using a laser thermal transfer device.

The method may further include subjecting the film to a pre-treatment process in an air or inert atmosphere in a washing chamber positioned at a front of the plurality of chambers.

Chambers of the plurality of chambers may be maintained in multi-stage vacuum states, and the transfer layer may be formed and the pattern of the film may be transferred in a high vacuum chamber of the plurality of chambers.

The high vacuum chamber may be connected to the substrate transfer chamber, and the substrate may be transferred from the substrate transfer chamber to transfer the pattern of the transfer layer formed on the film onto the substrate.

The film supplied in a roll-to-roll process may include a base film and a light-to-heat conversion layer formed on the base film, and forming the transfer layer on the surface of the film may include depositing the transfer layer on the light-to-heat conversion layer using the deposition unit.

The film may be supplied in a horizontal direction, and the deposition unit may be positioned below the film and spray a transfer layer-forming raw material from below the film toward an upper portion of the film.

The film may be supplied in a vertical direction, and the deposition unit may be spaced apart from the film, arranged parallel to the film, and spray a transfer layer-forming raw material in a horizontal direction.

Transferring the substrate into the chamber may include mounting the substrate on a tray.

The film may be supplied in a horizontal direction, and the laser thermal transfer device may be positioned above the film and irradiate laser beams from above the film toward a lower portion of the film to transfer the pattern of the transfer layer formed on the film onto the substrate.

The film may be supplied in a vertical direction, and the laser thermal transfer device may be spaced apart from the film, arranged parallel to the film, and irradiate laser beams in a horizontal direction to transfer the pattern of the transfer layer formed on the film onto the substrate.

The method may further include attaching the film on which the transfer layer is formed to the substrate using lamination rolls positioned between the deposition unit and the laser thermal transfer device.

The method may further include peeling the transferred film from the substrate using peeling rolls positioned next to the laser thermal transfer device.

BRIEF DESCRIPTION OF THE DRAWINGS

The above and other features and aspects of the present invention will become more apparent by describing in detail some exemplary embodiments thereof with reference to the attached drawings, in which.

DETAILED DESCRIPTION

Figure 1:
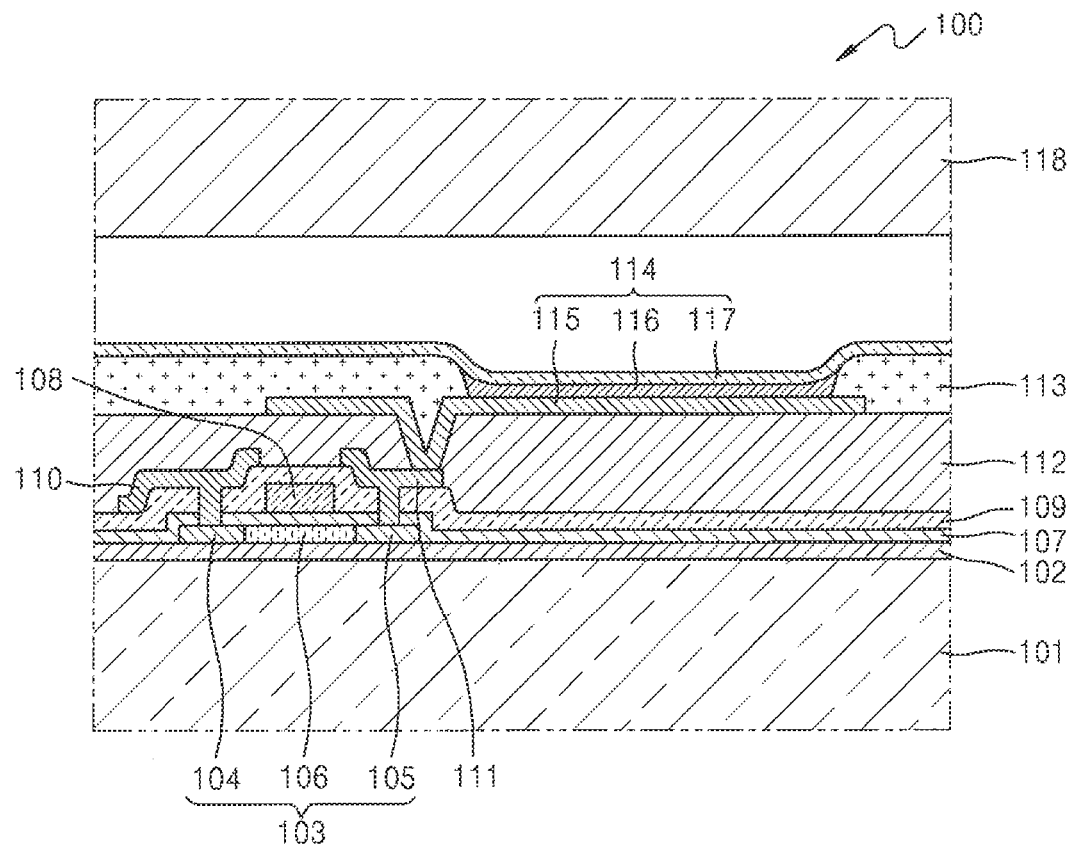
FIG. 1 is a partial cross-sectional view of an organic light-emitting display panel according to an embodiment of the present invention.

Some exemplary embodiments of the present invention are described more fully hereinafter with reference to the accompanying drawings; however, embodiments of the present invention may be embodied in different forms and should not be construed as limited to the exemplary embodiments illustrated and set forth herein. Rather, these exemplary embodiments are provided by way of example for understanding of the invention and to convey the scope of the invention to those skilled in the art. As those skilled in the art would realize, the described embodiments may be modified in various ways, all without departing from the spirit or scope of the present invention.

While such terms as "first," "second," etc., may be used to describe various components, such components are not necessarily limited to the above terms. The above terms are used only to distinguish one component from another.

The terms used in the following description are merely used to describe some exemplary embodiments, and are not intended to limit the present invention. An expression used in the singular encompasses the expression of the plural, unless it has a clearly different meaning in the context. In the following description, it is to be understood that terms such as "including" or "having," etc., are intended to indicate the existence of features, numbers, steps, actions, components, parts, and/or combinations thereof disclosed in the specification, and are not intended to preclude the possibility that one or more other features, numbers, steps, actions, components, parts, and/or combinations thereof may exist or may be added.

A device for manufacturing an organic light-emitting display panel, according to some exemplary embodiments of the present invention, and a method of manufacturing an organic light-emitting display panel using the same are described below with reference to the accompanying drawings, in which some exemplary embodiments of the present invention are shown. Like reference numerals in the drawings denote like elements.

FIG. 1 is a partial cross-sectional view of an organic light-emitting display panel 100 according to an embodiment of the present invention.

Referring to FIG. 1, the organic light-emitting display panel 100 includes a first substrate 101. The first substrate 101 may be an insulating substrate, such as a glass substrate or a plastic substrate.

A buffer layer 102 is formed on the first substrate 101. The buffer layer 102 may be formed of an organic material or an inorganic material, or may have a structure including both an organic material and an inorganic material, such as a structure in which an organic material and an inorganic material are alternately stacked. The buffer layer 102 prevents or substantially prevents permeation of oxygen and moisture and also prevents or substantially prevents diffusion of moisture or impurities generated from the first substrate 101.

A semiconductor active layer 103 is formed on the buffer layer 102. In one embodiment, the semiconductor active layer 103 is formed of polysilicon, and the polysilicon may be formed by preparing amorphous silicon and crystallizing the amorphous silicon.

The crystallization of the amorphous silicon may be performed using various methods such as rapid thermal annealing (RTA), solid phase crystallization (SPC), excimer laser annealing (ELA), metal-induced crystallization (MIC), metal-induced lateral crystallization (MILC), or sequential lateral solidification (SLS).

The semiconductor active layer 103 is doped with N-type or P-type impurity ions to form a source region 104 and a drain region 105. In one embodiment, the semiconductor active layer 103 includes, between the source region 104 and the drain region 105, a channel region 106 that is not doped with the N-type or P-type impurity ions.

A gate insulating layer 107 is deposited on the semiconductor active layer 103. The gate insulating layer 107 may be a single layer formed of $SiO_2$ or a double layer of $SiO_2$ and $SiN_x$.

A gate electrode 108 is formed on a portion (e.g., a predetermined portion) of the gate insulating layer 107. The gate electrode 108 is connected to a gate line (not shown) by which an on/off signal of a thin film transistor is applied. The gate electrode 108 may include one metal or a plurality of metals, and may be formed of a single layer of Mo, MoW, Cr, Al, an Al alloy, Mg, Al, Ni, W, or Au, or layers of a combination thereof.

An interlayer insulating layer 109 is formed on the gate insulating layer 107 to cover the gate electrode 108, a source electrode 110 is electrically connected to the source region 104 through a contact hole, and a drain electrode 111 is electrically connected to the drain region 105 through a contact hole.

A protective layer 112, including at least one of a passivation layer and a planarization layer, is formed on the interlayer insulating layer 109 to cover the source electrode 110 and the drain electrode 111. The protective layer 112 may be formed of an organic material such as acryl or benzocyclobutene (BCB), or an inorganic material such as $SiN_x$, and may be a single layer of an organic or inorganic material, or a double layer or layers of any combination of these materials.

In one embodiment, a first electrode 115 of an organic light-emitting diode (OLED) 114 is formed on the protective layer 112, and a pixel-defining layer (PDL) 113 of an organic material is formed on the protective layer 112 to cover portions of the first electrode 115. The first electrode 115 is electrically connected to one of the source electrode 110 or the drain electrode 111.

An organic layer 116 is formed on an exposed portion of the first electrode 115 which may be formed by etching a portion of the pixel-defining layer 113. A second electrode 117 of the OLED 114 is formed on the organic layer 116.

The first electrode 115 and the second electrode 117 are insulated from each other by the organic layer 116, and voltages having different polarities are applied therebetween to emit light from the organic layer 116.

The first electrode 115, in one embodiment, acts as an anode and may be formed of any of various conductive materials. The first electrode 115 may be a transparent electrode or a reflective electrode.

For example, in one embodiment, the first electrode 115 is a transparent electrode and may include ITO, IZO, ZnO, or $In_2O_3$. In another embodiment, the first electrode 115 is a reflective electrode, and a reflective layer of Ag, Mg, Al, Pt, Pd, Au, Ni, Nd, Ir, Cr, or any compounds of these materials is formed and ITO, IZO, ZnO, or $In_2O_3$ is then formed on the reflective layer.

The second electrode 117, in one embodiment, acts as a cathode and may be a transparent electrode or a reflective electrode.

In one embodiment, the second electrode 117 is a transparent electrode, and a metal having a low work function such as Li, Ca, LiF/Ca, LiF/Al, Al, Ag, Mg, or any compound thereof is deposited on a side of the organic layer 116, and an auxiliary electrode layer or bus electrode line composed of a material for forming a transparent electrode such as ITO, IZO, ZnO, or $In_2O_3$ is then formed on the metal.

In another embodiment, the second electrode 117 is a reflective electrode, and Li, Ca, LiF/Ca, LiF/Al, Al, Ag, Mg, or any compound thereof is deposited to form the second electrode 117.

When the first electrode 115 is formed as a transparent electrode or a reflective electrode, the first electrode 115 may be formed to correspond to a shape of an opening of each of a plurality of sub-pixels.

The second electrode 117 formed as a transparent electrode or a reflective electrode may be deposited on the entire display region. However, the second electrode 117 may not necessarily be deposited on the entire display region and may be formed in various patterns. In this regard, the second electrode 117 may be formed on the first electrode 115, or vice versa.

The organic layer 116 may be a low-molecule organic layer or a polymer organic layer.

Figure 2:
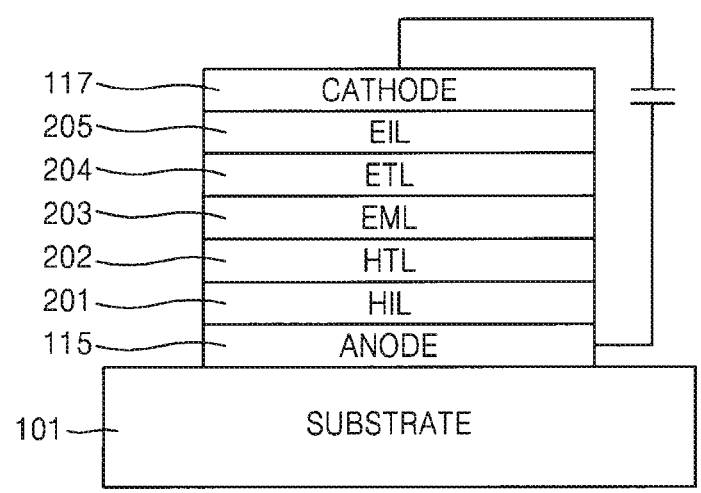
FIG. 2 is a schematic cross-sectional view illustrating an organic light-emitting diode on a substrate, according to an embodiment of the present invention.

In one embodiment, the organic layer 116 is formed of a low-molecule organic material, and the organic layer 116 may have, as illustrated in FIG. 2, a single or stacked structure including a hole injection layer (HIL) 201, a hole transport layer (HTL) 202, an emission layer (EML) 203, an electron transport layer (ETL) 204, and an electron injection layer (EIL) 205. The low-molecule organic material may include, for example, copper phthalocyanine (CuPc), N,N'-di(naphthalene-1-yl)-N,N'-diphenyl-benzidine (NPB), or tris-8-hydroxyquinoline aluminum ($Alq_3$). The low-molecule organic layer may be formed by vacuum deposition.

In one embodiment, the organic layer 116 is formed as a polymer organic layer, and the organic layer 116 generally includes the HTL and the EML. The HTL may be formed of PEDOT by screen printing or ink-jet printing, and the EML may be formed of a polymer organic material, such as polyphenylene vinylene (PPV) or polyfluorenes, by screen printing or ink-jet printing.

However, the organic layer 116 according to embodiments of the present invention is not limited to the above-described examples.

A second substrate 118 is formed on the OLED 114. The second substrate 118 may be a glass substrate or a flexible substrate, or may be formed by coating an insulating material on the OLED 114.

Figure 3:
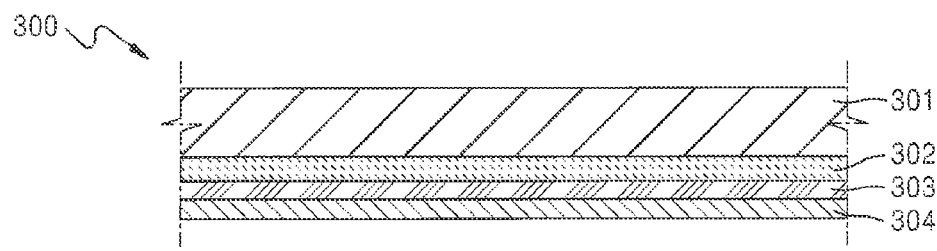
FIG. 3 is a cross-sectional view illustrating a state in which a transfer layer is deposited on a film supplied in a roll-to-roll process, according to an embodiment of the present invention.

FIG. 3 is a cross-sectional view illustrating a state after a transfer layer 304 is deposited on a film 300 that is supplied in a roll-to-roll process, according to an embodiment of the present invention.

Referring to FIG. 3, in one embodiment, the film 300 includes a base film 301 and a light-to-heat conversion layer 302 formed on the base film 301. In one embodiment, a gas blocking layer 303 may be formed on the light-to-heat conversion layer 302.

The base film 301 may be formed of a transparent polymer organic material, such as polyethylene terephthalate (PET), polyethylene naphthalate (PEN), polyethylene (PE), or polycarbonate (PC).

The light-to-heat conversion layer 302 converts incident light into heat and may include a light-absorbing material, such as aluminum oxide, aluminum sulfide, carbon black, graphite, or infrared ray pigments.

The gas blocking layer 303 is formed to prevent or substantially prevent gases generated during outgassing from being permeated into the transfer layer 304.

The transfer layer 304, in one embodiment, is formed on the gas blocking layer 303 by a deposition unit during a deposition process. In one embodiment, the transfer layer 304 is an organic transfer layer and may be one selected from the group consisting of the HIL, the HTL, the EML, the ETL, and the EIL. For example, in one embodiment, the transfer layer 304 is an EML.

Patterns of red, green, and blue emission layers are formed on a substrate by coating a low-molecule organic material or a polymer organic material on a film in an air atmosphere and irradiating laser beams on the coated film, or by mounting a film cut in a vacuum atmosphere on a tray, coating an organic material on the film, and then irradiating laser beams on the coated film.

However, when the LITI method is performed in an air atmosphere or in a certain atmosphere, it is difficult to improve the efficiency and lifetime of the EML. In addition, when the LITI method is performed in a vacuum atmosphere, equipment costs are high due to a complicated manufacturing device, a tact time is delayed, and separation of a film is difficult. Furthermore, in the LITI method performed in an air atmosphere, it is difficult to remove oxygen or moisture that has adverse effects on the lifetime of organic materials.

Figure 4:
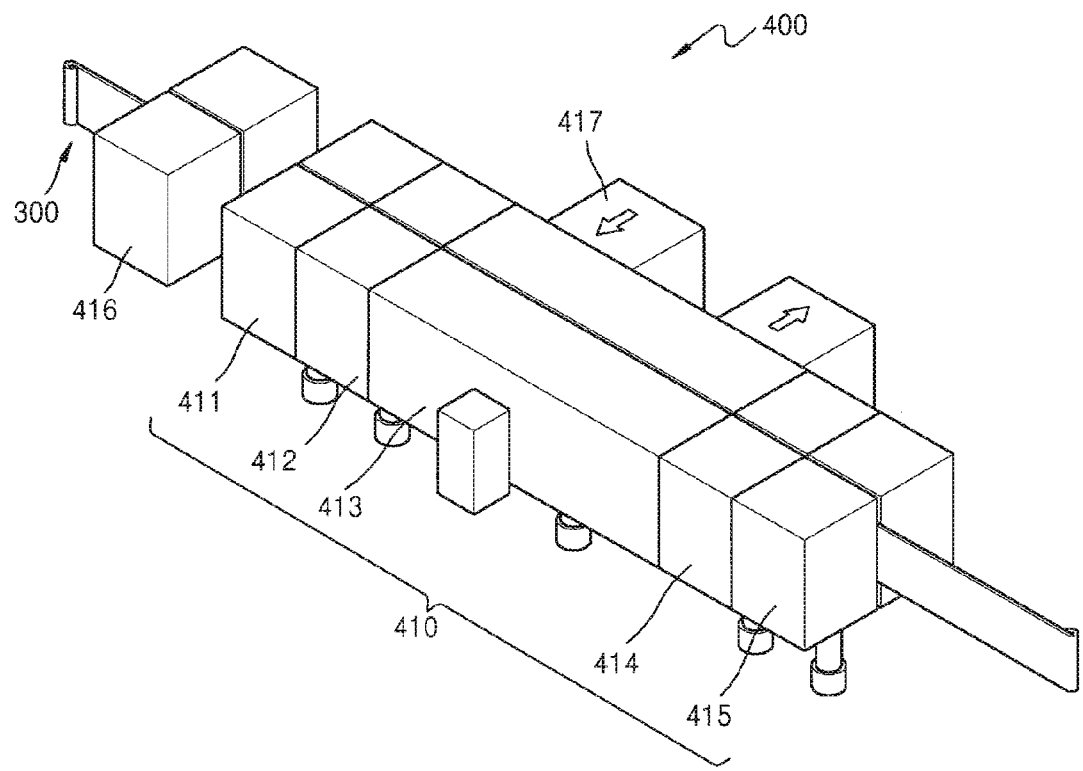
FIG. 4 is a schematic diagram illustrating a structure of a device for manufacturing an organic light-emitting display panel, according to an embodiment of the present invention.
Figure 5:
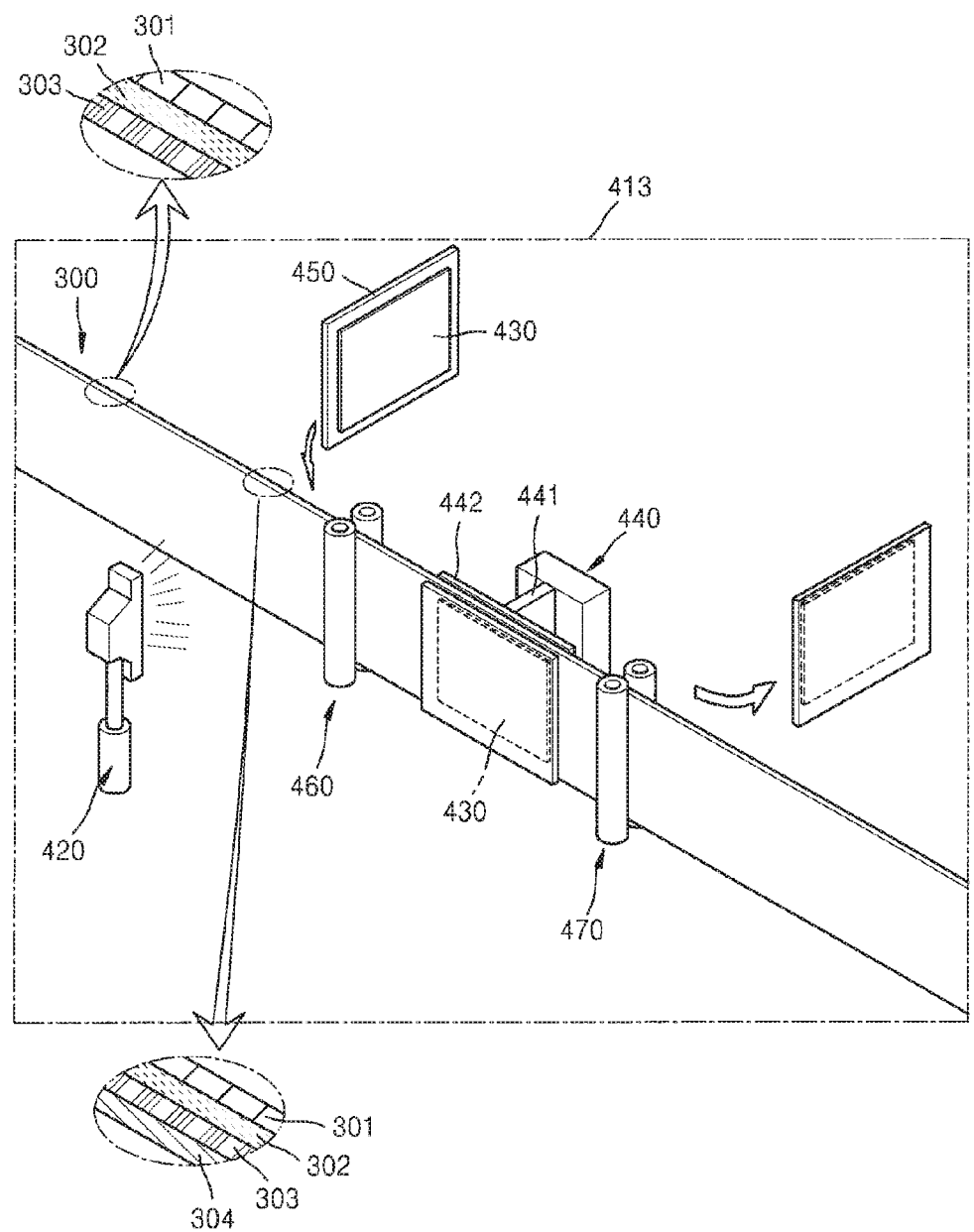
FIG. 5 is a partially exploded view of a high vacuum chamber of the device of FIG. 4, according to an embodiment of the present invention.

FIG. 4 is a schematic diagram illustrating a structure of a device 400 for manufacturing an organic light-emitting display panel, according to an embodiment of the present invention, and FIG. 5 is a partially exploded view of a high vacuum chamber of the device 400 of FIG. 4, according to an embodiment of the present invention.

Referring to FIGS. 4 and 5, the device 400 for manufacturing an organic light-emitting display panel, according to an embodiment of the present invention, includes a plurality of chambers 410, a deposition unit 420 that transfers a pattern onto the film 300 transferred into the chambers 410, and a laser thermal transfer device 440 that transfers the pattern of the film 300 onto a substrate 430 transferred into the chambers 410.

The chambers 410, in one embodiment, are vacuum chambers that maintain multi-stage vacuum states. The chambers 410, in one embodiment, include a first vacuum chamber 411, a second vacuum chamber 412, a third vacuum chamber 413, a fourth vacuum chamber 414, and a fifth vacuum chamber 415. The first through fifth vacuum chambers 411 through 415 are sequentially positioned in line with one another. However, while the chambers 410 are configured to maintain the multi-stage vacuum states, the number of vacuum chambers is not limited to a particular number of vacuum chambers.

In one embodiment, the first vacuum chamber 411 and the fifth vacuum chamber 415 are maintained in a low vacuum atmosphere of $10^{-2}$ torr or less, the second vacuum chamber 412 and the fourth vacuum chamber 414 are maintained in a medium vacuum atmosphere of $10^4$ torr or less, and the third vacuum chamber 413 is maintained in a high vacuum atmosphere of $10^{-6}$ torr or less. In one embodiment, a process of depositing a material on the film 300 and a process of transferring the pattern of the film 300 onto the substrate 430 are performed in the third vacuum chamber 413 maintained in a high vacuum atmosphere.

In one embodiment, a washing chamber 416 may be further positioned in front of the first vacuum chamber 411. The washing chamber 416 is not necessarily maintained in a vacuum atmosphere and may be maintained in an air or inert atmosphere. The washing chamber 416 is a chamber for pretreatment processes including washing for removing impurities remaining on the film 300 supplied in a roll-to-roll process.

A substrate transfer chamber 417 is connected to a side of the third vacuum chamber 413. The substrate transfer chamber 417 transfers the substrate 430 into the third vacuum chamber 413 maintained in a high vacuum atmosphere. The substrate transfer chamber 417 transfers the substrate 430 into the third vacuum chamber 413, and transfers the substrate 430 with transferred patterns thereon outside the third vacuum chamber 413. The substrate transfer chamber 417, in one embodiment, is maintained substantially in the same atmosphere as the atmosphere in which the third vacuum chamber 413 is maintained.

The film 300, in one embodiment, includes the light-to-heat conversion layer 302 and the gas blocking layer 303 that are sequentially formed on the base film 301, as illustrated in FIG. 3. The film 300, in one embodiment, is flexible and may be composed of a flexible material so as to be supplied into the chambers 410 in a roll-to-roll process without cutting the film 300.

The film 300, in one embodiment, is unwound from an unwinding roller (not shown) and continuously supplied into the chambers 410. After the deposition and transferring processes are completed, the film 300 is wound on a winding roller. The film 300 supplied in a roll-to-roll process may be transferred in a direction parallel to the chambers 410 or in a direction perpendicular to the chambers 410.

The deposition unit 420 is used to deposit the transfer layer 304 on the film 300. The deposition unit 420 may deposit the transfer layer 304 on the film 300 by heating a deposition material at a temperature (e.g., a predetermined temperature) by using a resistance heating method to form the deposition material in a steam phase. The deposition unit 420 may deposit a deposition material from a lower portion to an upper portion of the film 300 along a direction in which the film 300 is supplied in a roll-to-roll process, or may deposit a deposition material on the film 300 in a direction substantially perpendicular or parallel to the film 300.

In one embodiment, the transfer layer 304 that is deposited on the film 300 is the EML 203, but embodiments of the present invention are not limited thereto. For example, a single structure selected from a HIL, a HTL, an ETL, or an EIL, or a composite structure including these layers may be deposited on the film 300.

The substrate 430 may be, but is not limited to, a large substrate such as a mother glass substrate. Also, the substrate 430 may be an insulating substrate, such as a glass substrate or a plastic substrate. The substrate 430 may be transferred from the substrate transfer chamber 417 by being mounted on a tray 450. The substrate 430 may be transferred into the third vacuum chamber 413 through a conveyor system (not shown), or the position of the substrate 430 may be changed by a robot instrument.

The laser thermal transfer device 440 transfers the transfer layer 304 deposited on the film 300 to a surface of the substrate 430. The laser thermal transfer device 440 irradiates laser beams 441 to the film 300.

The laser thermal transfer device 440, in one embodiment, includes a laser beam generation unit (not shown) from which the laser beams 441 are irradiated, an optical system (not shown) for shaping laser beams, a pattern mask 442 positioned on the substrate 430, and a control unit (not shown) for controlling the laser beam generation unit, the optical system, and the pattern mask 442.

The laser beam generation unit generates laser beams and may be a solid laser such as a ruby laser, a glass laser, a YAG laser, or a YLF laser, or a gas laser such as an excimer laser or a helium-neon laser.

The optical system is positioned on a path in which the laser beams 441 generated from the laser beam generation unit proceed. The optical system may include a homogenizer that homogenizes a shape of the laser beams 441 to form the laser beams 441 to have a desired shape. The laser thermal transfer device 440 may further include a mirror on the path of the laser beams 441 that are transmitted through the optical system to change an angle of the laser beams 441.

The laser beams 441 that are transmitted through the optical system may be formed to have a desired shape such as a line or a tetragon. The optical system may further include one or more various lens groups such as a condenser lens, a polarizer, and the like. The mirror may be a Galvano mirror or a reflective mirror that linearly alters an angle of a mirror according to a change in an applied voltage.

The pattern mask 442, in one embodiment, is an optical mask disposed between the laser thermal transfer device 440 and the substrate 430. The pattern mask 442 may include at least one of the light transmission patterns or at least one of the light reflection patterns. The laser beams 441 that are transmitted through an opening formed in the pattern mask 442 may be irradiated on the film 300 on which the transfer layer 304 is deposited, which is attached to the substrate 430.

In one embodiment, lamination rolls 460 may be formed between the deposition unit 420 and the laser thermal transfer device 440 to attach to the substrate 430 the film 300 on which the transfer layer 304 is formed. In one embodiment, the substrate 430 mounted on the tray 450 is positioned on a surface of the film 300, and when the film 300 with the substrate 430 disposed thereon is passed through the lamination rolls 460, the film 300 may be attached to the substrate 430 by static electricity. A surface of the film 300 on which the transfer layer 304 is formed is attached facing the substrate 430.

In one embodiment, peeling rolls 470 may be positioned next to (e.g., downstream of) the laser thermal transfer device 440 to peel the film 300 from the substrate 430 after the transferring process.

The third vacuum chamber 413 may further include an alignment unit (not shown). When the transfer layer 304 formed on the film 300 is transferred onto the substrate 430, the alignment unit aligns the pattern mask 442 with respect to the substrate 430 mounted on the tray 450.

Deposition and transferring processes performed by using the device 400 for manufacturing an organic light-emitting display panel as described above are described below in further detail with reference to FIGS. 4 and 5.

In one embodiment, the film 300 is supplied into the chambers 410 in a roll-to-roll process. The film 300 supplied into the chambers 410 may include the light-to-heat conversion layer 302 and the gas blocking layer 303 that are sequentially formed on the base film 301. The film 300 may be composed of a flexible material so as to be continuously supplied into the chambers 410 without cutting the film 300. In one embodiment, the film 300 may be transferred in a direction parallel to the chambers 410 or in a direction perpendicular to the chambers 410. In one embodiment, the film 300 is transferred in a direction perpendicular to the chambers 410.

The washing chamber 416, in one embodiment, is positioned at an entrance of the plurality of chambers 410. The film 300 supplied in a roll-to-roll process may be subjected to a pre-treatment process by the washing chamber 416 to remove impurities remaining on the film 300, before the film 300 is supplied into the chambers 410. The washing chamber 416 may not necessarily be maintained in a vacuum atmosphere, and may be maintained in an air or inert atmosphere.

The transfer layer 304 is formed on the film 300 supplied in a roll-to-roll process by the deposition unit 420 in the third vacuum chamber 413 maintained in a high vacuum atmosphere after the film 300 is supplied to the third vacuum chamber 413 via the first vacuum chamber 411 maintained in a low vacuum atmosphere and the second vacuum chamber 412 maintained in a medium vacuum atmosphere.

Figure 6:
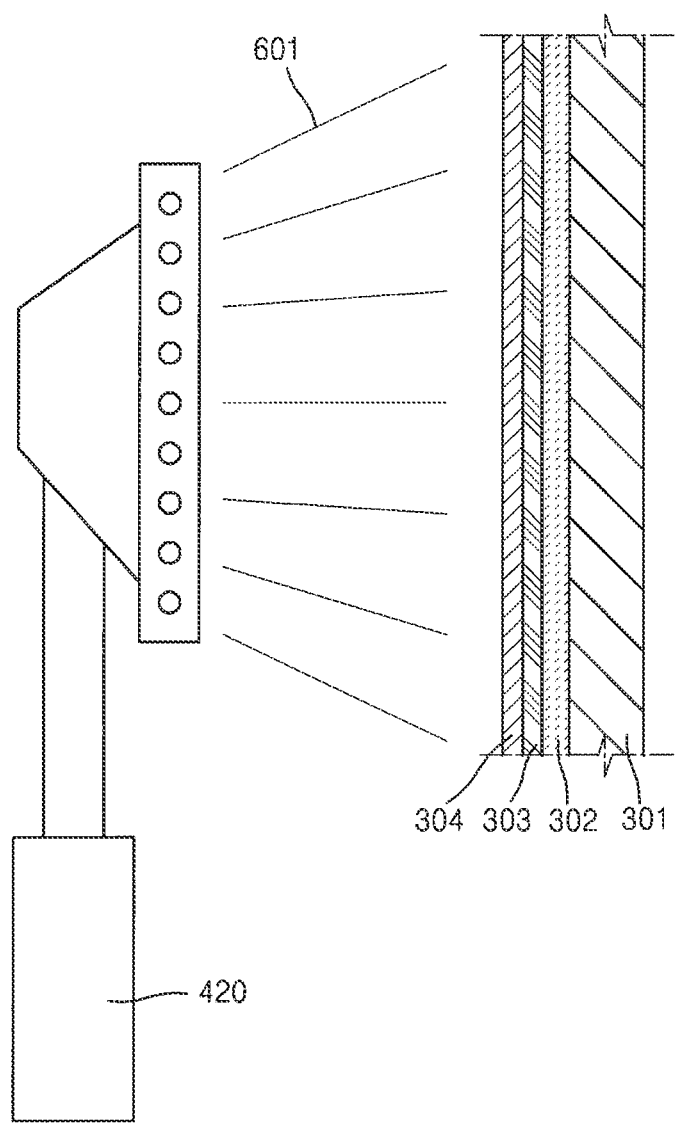
FIG. 6 is a schematic view of a deposition unit of the device of FIG. 4, according to an embodiment of the present invention.

Referring to FIG. 6, in one embodiment, the film 300 supplied in a roll-to-roll process is transferred in a direction perpendicular to the chambers 410. The deposition unit 420 is positioned at one side of the film 300. The deposition unit 420 is spaced apart (e.g., by a predetermined distance) from the film 300 and positioned parallel to the film 300, and a transfer layer-forming raw material 601 is sprayed onto the film 300 in a horizontal or substantially horizontal direction. In one embodiment, the transfer layer-forming raw material 601 is deposited on a surface of the gas-blocking layer 303 to form the transfer layer 304. In one embodiment, the gas-blocking layer 303 is not formed on the film 300, and the transfer layer-forming raw material 601 may be deposited on a surface of the light-to-heat conversion layer 302.

In one embodiment, the transfer layer-forming raw material 601 may be sprayed onto the base film 301 from the deposition unit 420, thereby forming the transfer layer 304 (e.g., an EML) on the base film 301.

Alternatively, the film 300 supplied in a roll-to-roll process may be transferred in a horizontal direction, and the deposition unit 420 may be positioned below the film 300, and the transfer layer-forming raw material 601 may be sprayed from a lower portion toward an upper portion of the film 300 to form the transfer layer 304 on the base film 301.

Referring back to FIGS. 4 and 5, the substrate 430 is disposed on the film 300 on which the transfer layer 304 is formed. The substrate 430 is transferred from the substrate transfer chamber 417 connected to the third vacuum chamber 413. The substrate 430, in one embodiment, is transferred by being mounted on the tray 450.

The transferred substrate 430 is positioned on a surface of the film 300. The lamination rolls 460 are positioned in front of the laser thermal transfer device 440, that is, between the deposition unit 420 and the laser thermal transfer unit 440, to attach the film 300 with the transfer layer 304 formed thereon to the substrate 430. The film 300 and the substrate 430 may be attached to each other by static electricity while being passed through the lamination rolls 460 such that a surface of the film 300 on which the transfer layer 304 is formed is attached to the substrate 430.

Subsequently, the transfer layer 304 is transferred onto the substrate 430 by the laser thermal transfer device 440.

In one embodiment, the film 300 supplied in a roll-to-roll process is transferred in a vertical direction. The laser thermal transfer device 440 is positioned at one side of the film 300. The laser thermal transfer device 440 is spaced apart (e.g., by a predetermined distance) from the film 300 and may be parallel to the film 300.

The pattern mask 442 and the film 300 are disposed between the laser thermal transfer device 440 and the substrate 430. The pattern mask 442 may include at least one of the light transmission patterns or at least one of the light reflection patterns.

Figure 7:
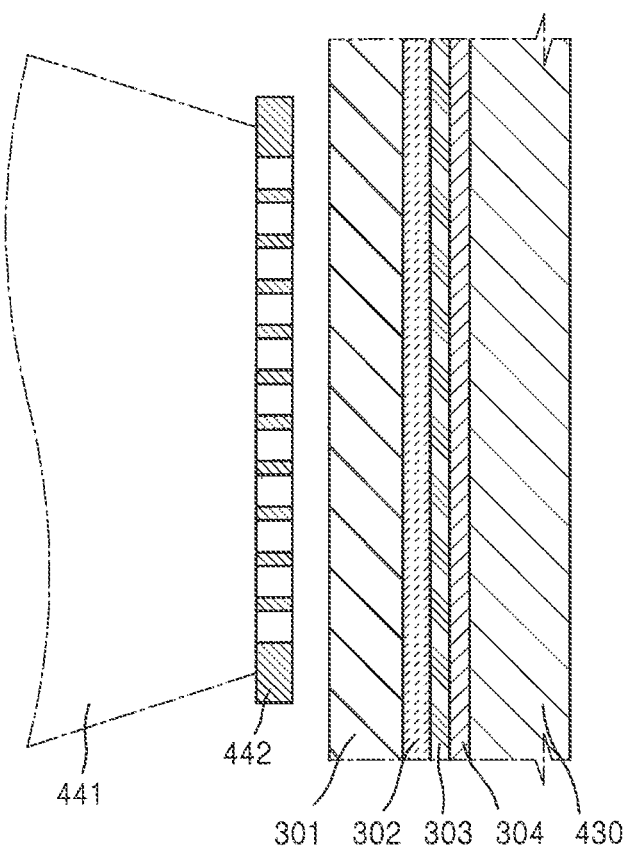
FIG. 7 is a partial schematic view of a laser thermal transfer device of the device of FIG. 4, according to an embodiment of the present invention.

Referring to FIG. 7, the laser beams 441 emitted from the laser thermal transfer device 440 are transmitted through openings formed in the pattern mask 442 and irradiated on the transfer layer 304 attached to the substrate 430, thereby transferring a desired pattern of the transfer layer 304 onto the substrate 430.

Alternatively, in another embodiment, the film 300 supplied in a roll-to-roll process is transferred in a horizontal direction, and the laser thermal transfer device 400 that is positioned above the substrate 430 with the film 300 attached thereto irradiates the laser beams 441 from an upper portion toward a lower portion of the film 300 to transfer a desired pattern of the transfer layer 304 onto the substrate 430.

When the transfer layer 304 formed on the film 300 is transferred onto the substrate 430, the alignment unit may align the pattern mask 442 with respect to the substrate 430 mounted on the tray 450, and thus a position error between the pattern mask 442 and the substrate 430 may be minimized or reduced.

As described above, referring back to FIG. 5, the peeling rolls 470 may be positioned after (e.g., next to) the laser thermal transfer device 440. After the transferring process is completed, the film 300 is peeled from the substrate 430 while being passed through the peeling rolls 470.

Subsequently, the substrate 430 to which the desired pattern of the transfer layer 304 is transferred is transferred to the substrate transfer chamber 417, thereby completing the deposition and transferring processes.

As described above, the deposition and transferring processes of a layer, such as an EML of a single color, are performed by supplying the film 300 into the plurality of chambers 410 in a roll-to-roll process. After the deposition and transferring processes are completed, the above-described processes may be repetitively performed, thereby depositing and transferring emission layers of other colors.

Some aspects of the device for manufacturing an organic light-emitting display panel and the method of manufacturing an organic light-emitting display panel by using the same according to embodiments of the present invention are set forth below.

A film may be supplied in a roll-to-roll process, and thus a separate tray on which the film is mounted is not needed.

A space for storing a film after a laser transferring process is completed is not needed, thereby simplifying the structure of the manufacturing device.

A transferring process is performed in a high vacuum chamber, and thus permeation of unnecessary gas into an EML may be prevented or substantially prevented.

A transferring process of the film during the deposition and laser transferring processes is simplified, a tact time due to the preparation of the film may be shortened, and a speed of the film may be adjustable.

The film is supplied in a roll-to-roll process, and thus the film may be transferred in a horizontal or vertical direction.

The film may be peeled from a substrate in a vacuum chamber after the transferring process, and thus damage to the film by air or gas during the peeling process may be prevented or substantially prevented.

A laser thermal transfer device may adjust a speed of a transferring process performed on the substrate.

While the present invention has been particularly shown and described with reference to some exemplary embodiments thereof, it will be understood by those of ordinary skill in the art that various changes in form and details may be made therein without departing from the spirit and scope of the present invention as defined by the following claims.

What is claimed is:

1. A method of manufacturing an organic light-emitting display panel, the method comprising:
   continuously supplying a film into a plurality of chambers in a roll-to-roll process;
   forming a transfer layer on a surface of the film using a deposition unit;
   transferring a substrate into a chamber of the plurality of chambers from a substrate transfer chamber; and
   transferring a pattern of the transfer layer formed on the film onto the substrate using a laser thermal transfer device that is spaced apart from the film,
   wherein a pattern mask is disposed between the laser thermal transfer device and the film,
   wherein a laser beam emitted from the laser thermal transfer device is transmitted through an opening formed in the pattern mask and irradiated on the film on which the transfer layer is deposited,
   wherein forming the transfer layer on the surface of the film using the deposition unit and transferring the pattern of the transfer layer onto the substrate using the laser thermal transfer device are performed in a same chamber of the plurality of chambers,
   wherein the substrate transfer chamber is maintained substantially in the same atmosphere in which the same chamber of the plurality of chambers is maintained.

2. The method of claim 1, wherein the film supplied in a roll-to-roll process comprises a base film and a light-to-heat conversion layer formed on the base film, and wherein forming the transfer layer on the surface of the film comprises depositing the transfer layer on the light-to-heat conversion layer using the deposition unit.

3. The method of claim 2, wherein the film is supplied in a horizontal direction, and the deposition unit is positioned below the film and sprays a transfer layer-forming raw material from below the film toward an upper portion of the film.

4. The method of claim 2, wherein the film is supplied in a vertical direction, and the deposition unit is spaced apart from the film, arranged parallel to the film, and sprays a transfer layer-forming raw material in a horizontal direction.

5. The method of claim 1, wherein chambers of the plurality of chambers are maintained in multi-stage vacuum states, and the transfer layer is formed and the pattern of the film is transferred in a high vacuum chamber of the plurality of chambers.

6. The method of claim 5, wherein the high vacuum chamber is connected to the substrate transfer chamber, and the substrate is transferred from the substrate transfer chamber to transfer the pattern of the transfer layer formed on the film onto the substrate.

7. The method of claim 1, further comprising subjecting the film to a pre-treatment process in an air or inert atmosphere in a washing chamber positioned at a front of the plurality of chambers.

8. The method of claim 1, wherein transferring the substrate into the chamber comprises mounting the substrate on a tray.

9. The method of claim 1, wherein the film is supplied in a horizontal direction, and the laser thermal transfer device is positioned above the film and irradiates laser beams from above the film toward a lower portion of the film to transfer the pattern of the transfer layer formed on the film onto the substrate.

10. The method of claim 1, wherein the film is supplied in a vertical direction, and the laser thermal transfer device is arranged parallel to the film, and irradiates laser beams in a horizontal direction to transfer the pattern of the transfer layer formed on the film onto the substrate.

11. The method of claim 1, further comprising attaching the film on which the transfer layer is formed to the substrate using lamination rolls positioned between the deposition unit and the laser thermal transfer device.

12. The method of claim 1, further comprising peeling the transferred film from the substrate using peeling rolls positioned next to the laser thermal transfer device.

* * * * *